United States Patent
Bahl et al.

(10) Patent No.: US 8,513,703 B2
(45) Date of Patent: Aug. 20, 2013

(54) GROUP III-NITRIDE HEMT WITH MULTI-LAYERED SUBSTRATE HAVING A SECOND LAYER OF ONE CONDUCTIVITY TYPE TOUCHING A TOP SURFACE OF A FIRST LAYERS OF DIFFERENT CONDUCTIVITY TYPE AND A METHOD FOR FORMING THE SAME

(75) Inventors: Sandeep Bahl, Palo Alto, CA (US); Constantin Bulucea, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 335 days.

(21) Appl. No.: 12/908,514

(22) Filed: Oct. 20, 2010

(65) Prior Publication Data

US 2012/0098036 A1  Apr. 26, 2012

(51) Int. Cl.
*H01L 21/338* (2006.01)
*H01L 29/778* (2006.01)

(52) U.S. Cl.
USPC ............... 257/171; 257/194; 257/E29.246; 257/E21.403; 438/172

(58) Field of Classification Search
USPC .......... 257/194, 200, 201, E29.246, E21.403, 257/171; 438/172
See application file for complete search history.

(56) References Cited

U.S. PATENT DOCUMENTS

| | | | |
|---|---|---|---|
| 3,029,366 A | | 4/1962 | Lehovec |
| 3,671,821 A | * | 6/1972 | Josuke Nakata et al. ..... 257/154 |
| 3,697,829 A | * | 10/1972 | Huth et al. .................... 257/171 |
| 3,859,127 A | | 1/1975 | Lehner |
| 4,980,315 A | | 12/1990 | Einthoven et al. |
| 6,020,603 A | * | 2/2000 | Tokunoh et al. ............... 257/171 |
| 6,120,909 A | | 9/2000 | Bojarczuk, Jr. et al. |
| 8,314,447 B2 | * | 11/2012 | Hirler et al. ................... 257/194 |
| 2006/0006415 A1 | | 1/2006 | Wu et al. |
| 2006/0124960 A1 | * | 6/2006 | Hirose et al. .................. 257/189 |
| 2006/0202272 A1 | | 9/2006 | Wu et al. |
| 2008/0230786 A1 | | 9/2008 | Heikman et al. |
| 2008/0296622 A1 | * | 12/2008 | Kiewra et al. ................. 257/194 |
| 2012/0153355 A1 | * | 6/2012 | Umeda et al. ................. 257/192 |

FOREIGN PATENT DOCUMENTS

EP  1826823 A2  8/2007

OTHER PUBLICATIONS

U.S. Appl. No. 12/908,458, filed Oct. 20, 2010, Sandeep Bahl et al. See IDS Transmittal Letter for Relevance.
Tanaka, S. et al., "Electron-beam-induced-current investigation of GaN/AlGaN/Si heterostructures using scanning transmission electron microscopy", Journal of Electron Microscopy, 56(4), 2007, pp. 141-144.

(Continued)

*Primary Examiner* — Anh Mai
(74) *Attorney, Agent, or Firm* — Eugene C. Conser; Wade J. Brady III; Frederick J. Telecky, Jr.

(57) ABSTRACT

The Si substrate of a group III-N HEMT is formed in layers that define a p-n junction which electrically isolates an upper region of the Si substrate from a lower region of the Si substrate. As a result, the upper region of the Si substrate can electrically float, thereby obtaining a full buffer breakdown voltage, while the lower region of the Si substrate can be attached to a package by way of a conductive epoxy, thereby significantly improving the thermal conductivity of the group III-N HEMT and minimizing undesirable floating-voltage regions.

12 Claims, 14 Drawing Sheets

(56) References Cited

OTHER PUBLICATIONS

Obreja, V.V.N., "The Semiconductor-Dielectric Interface from PN Junction Edge and the Voltage Dependence of Leakage Reverse Current", International Semiconductor Device Research Symposium (ISDRS), 2007, pp. 1-2 (unnumbered).

Obreja, V.V.N. et al., "Experimental Investigation on the Leakage Reverse Current Component Flowing at the Semiconductor PN Junction Periphery", 7th Int. Conf. on Thermal, Mechanical and Multiphysics Simulation and Experiments in Micro-Electronics and Micro-Systems, EuroSimE, 2006, pp. 1-6.

Mishra, U.K. et al., "AlGaN/GaN HEMTs—An Overview of Device Operation and Applications", Proceedings of the IEEE, vol. 90, No. 6, 2002, pp. 10221031.

Baliga, B.J., "Fundamentals of Power Semiconductor Devices", Springer Science, 2008, pp. 137-149.

Umeda, H. et al., "Blocking-Voltage Boosting Technology for GaN Transistors by Widening Depletion Layer in Si Substrates", International Electron Devices Meeting (IEDM), Dec. 2010, pp. 480-483.

PCT International Search Report for PCT/US2011/046066, Mar. 12, 2012.

PCT Written Opinion of the International Searching Authority for PCT/US2011/046066, Mar. 12, 2012.

* cited by examiner

GROUP III-NITRIDE HEMT WITH MULTI-LAYERED SUBSTRATE HAVING A SECOND LAYER OF ONE CONDUCTIVITY TYPE TOUCHING A TOP SURFACE OF A FIRST LAYERS OF DIFFERENT CONDUCTIVITY TYPE AND A METHOD FOR FORMING THE SAME

BACKGROUND OF THE INVENTION

1. Field of the Invention

The present invention relates to a Group III-N high electron mobility transistor (HEMT) and, more particularly, to a Group III-N HEMT with a floating substrate region and a grounded substrate region.

2. Description of the Related Art

Group III-N high electron mobility transistors (HEMTs) have shown potential superiority for power electronics due to their wider bandgap and better electron transport properties. These material properties translate into high breakdown voltage, low on-resistance, and fast switching. Group III-N HEMTs can also operate at higher temperatures than silicon-based transistors. These properties make group III-N HEMTs well suited for high-efficiency power regulation applications, such as lighting and vehicular control.

FIG. 1 shows a cross-sectional view that illustrates a conventional group III-N HEMT 100. As shown in FIG. 1, group III-N HEMT 100 includes a substrate 110, and a layered region 112 that is formed on the top surface of the substrate 110. The layered region 112, in turn, includes a barrier layer 114 at the top, a channel layer 116 in the middle, and a buffer layer 118 at the bottom that lies between the substrate 110 and the channel layer 116. The barrier layer 114, the channel layer 116, and the buffer layer 118 are each typically implemented with one or more sequential group-III nitride layers, with the group-III including one or more of In, Ga, and Al. The barrier layer 114 is commonly formed from AlGaN, and the channel layer 116 is commonly formed from GaN.

As discussed in Mishra et al., "AlGaN/GaN HEMTs—An Overview of Device Operation and Applications", Proceedings of the IEEE, Vol. 90, No. 6, June 2002, pp. 1022-1031, the channel layer and the barrier layer of an HEMT have different polarization properties and band gaps that induce the formation of a two-dimensional electron gas (2DEG) that lies at the top of the channel layer. The 2DEG, which has a high concentration of electrons, is similar to the channel in a conventional field effect transistor (FET). These electrons move at a comparatively higher speed than in a silicon MOSFET due to the characteristic high mobility of the material combined with the absence of undesirable collisions with dopant impurities.

Native group III-N substrates are not easily available, so the layered region 112 is conventionally grown on the substrate 110 using epitaxial deposition techniques such as metal organic chemical vapor deposition (MOCVD) and molecular beam epitaxy (MBE). The buffer layer 118 provides a transition layer between the substrate 110 and the channel layer 116 in order to address the difference in lattice constant and to provide a dislocation-minimized growing surface.

The substrate 110 is commonly implemented with SiC because SiC has a reasonably low lattice mismatch (~3%) and a high thermal conductivity. SiC substrates, however, are expensive and limited in size. The substrate 110 is also commonly implemented with Si due to the low cost of Si and access to Si processing infrastructure. Si substrates, however, limit the thickness of the buffer layer 118 to 2-3 um on a 6-inch substrate due to the stress and subsequent bowing of the wafer.

One of the limitations of a 2-3 um buffer thickness is that a thin buffer layer places a limit on the breakdown voltage of the device. For instance, a 2 um thick buffer breaks down at 300V. One approach to increasing the buffer breakdown voltage is to float the substrate. By floating the substrate, the buffer breakdown voltage from drain to source is doubled to 600V because the voltage is supported by two buffer layer thicknesses.

For example, as shown in FIG. 1, when a Si substrate is floated and the drain-to-source breaks down, the breakdown current follows a path from the drain to the source that includes the breakdown path segments A, B, and C. The breakdown path segments A and C each have a breakdown voltage of approximately 300V, whereas the breakdown path segment B is ohmic. Thus, in order to achieve the full breakdown voltage (600V), the substrate 110 must be able to float up to half the breakdown voltage (300V).

However, the requirement for a floating substrate causes a major issue for packaging. If a conventional package is used, the group III-N HEMT is attached using a non-conductive epoxy. Non-conductive epoxies, however, have worse thermal conductivity than conductive epoxies. This will cause a serious problem, since the group III-N device is intended for power applications, and needs to have a good heat sink. There are packages with improved heat sinking, which use an intermediate insulating layer with high thermal conductivity like AlN. However, these are expensive and still have lower thermal conductivity than direct-attach with a conductive epoxy.

In addition to packaging, the requirement for a floating substrate also has several other issues. A floating substrate can cause crosstalk from capacitive coupling between adjacent devices. In addition, if the floating voltage changes rapidly, EMI radiation is a concern. Further, the voltage of a floating substrate is not controlled, since the substrate is not directly contacted. Unregulated voltages are not desirable in circuit design. Thus, there is a need for alternate approaches to forming group III-N HEMTs.

DETAILED DESCRIPTION OF THE INVENTION

FIGS. 2-6 show a series of cross-sectional views that illustrate an example of a method of forming a group III-N HEMT 200 in accordance with the present invention. As described in greater detail below, the method of the present invention forms a p-n junction in a silicon substrate that allows the upper portion of the Si substrate to electrically float, while also allowing the lower portion of the Si substrate to be connected to a package with conductive epoxy.

Figure 1:
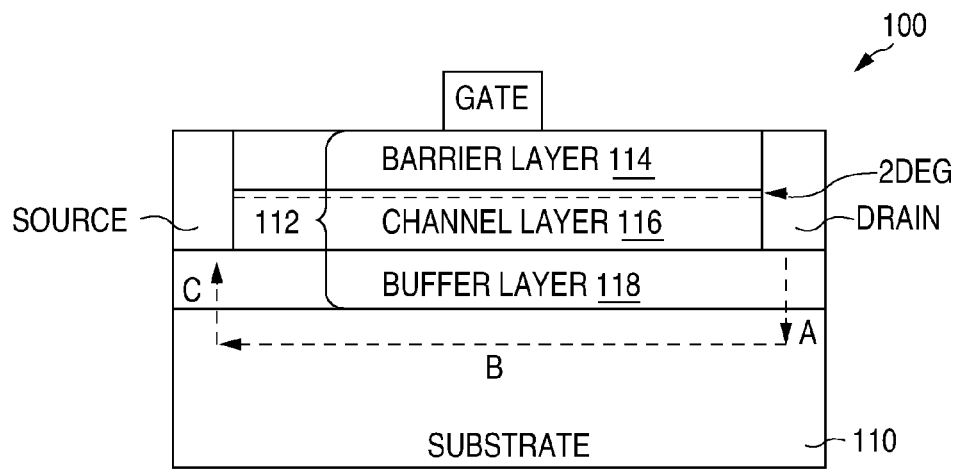
FIG. 1 is a cross-sectional view illustrating a conventional group III-N HEMT 100.
Figure 2:
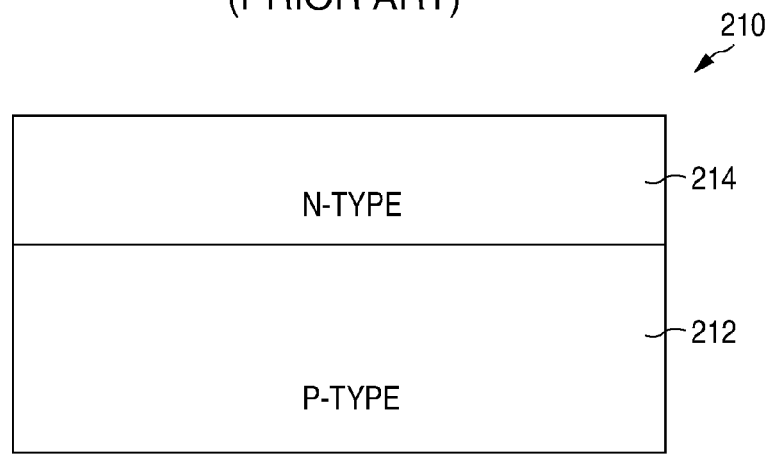
FIGS. 2-6 are a series of cross-sectional views illustrating an example of a method of forming a group III-N HEMT 200 in accordance with the present invention.

As shown in FIG. 2, the method of the present invention begins by forming a multi-layered substrate structure 210 that includes a p-type lower layer 212 and an n-type upper layer 214. The p-type lower layer 212, which has a substantially uniform thickness, is substantially thicker than the n-type upper layer 214, which has a substantially uniform thickness. As a result, the bottom surface of the p-type lower layer 212 and the bottom surface of the n-type upper layer 214 lie in substantially parallel planes.

In a preferred 500V embodiment, p-type lower layer 212 would be doped to $5 \times 10^{15}$ cm$^{-3}$, while n-type upper layer 214 would be grown 75 μm thick and doped to $5 \times 10^{14}$ cm$^{-3}$. In addition, the top surface of n-type upper layer 214 would be heavily doped, e.g., $10^{18}$ to $10^{19}$. The multi-layered substrate structure 210, in turn, can be formed in several different ways.

Figure 3:
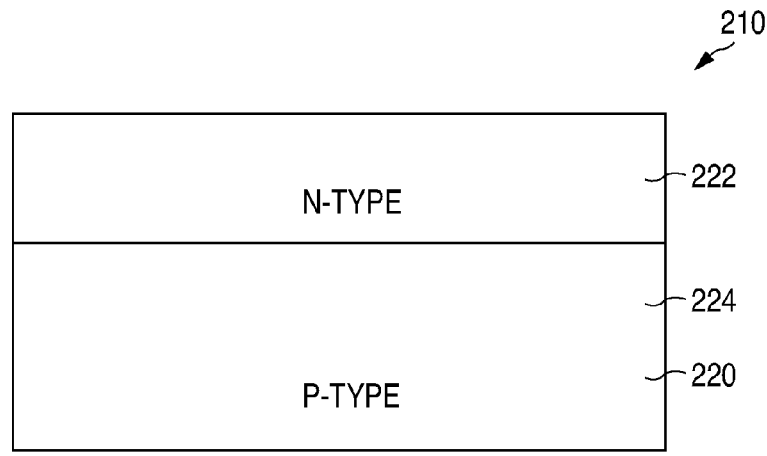

For example, as shown in FIG. 3, in a first embodiment, the multi-layered substrate structure 210 can be formed with a method that utilizes a conventionally-formed, lightly-doped, p-type, single-crystal Si substrate 220, such as <111>, and begins by blanket implanting an n-type dopant, such as phosphorous and/or arsenic, into the top surface of the Si substrate 220. The blanket implant is then followed by an anneal that diffuses and activates the implant to form an upper n-type layer 222 that touches a p-type bottom layer 224.

Figure 4:
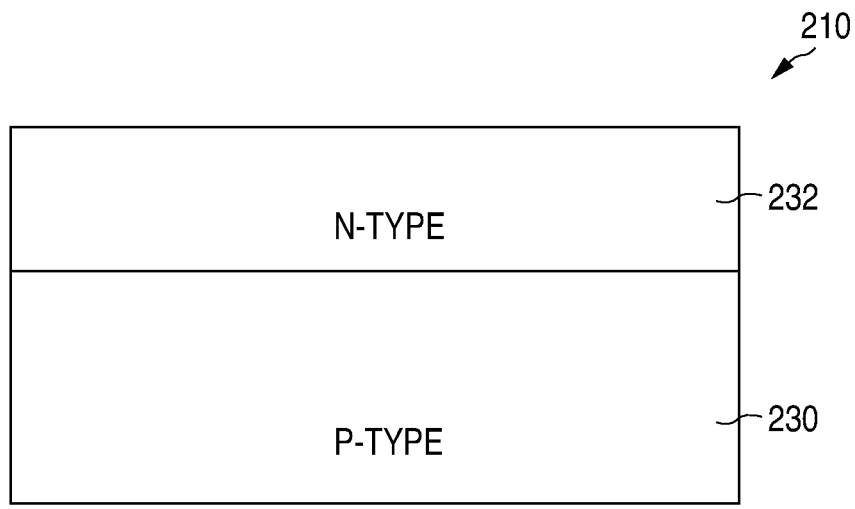

Alternately, as shown in FIG. 4, in a second embodiment, the multi-layered substrate structure 210 can be formed with a method that utilizes a conventionally-formed, lightly-doped, p-type, single-crystal Si substrate 230, such as <111>, and begins by epitaxially growing an n-type Si layer 232 on the top surface of the Si substrate 230.

Figure 5:
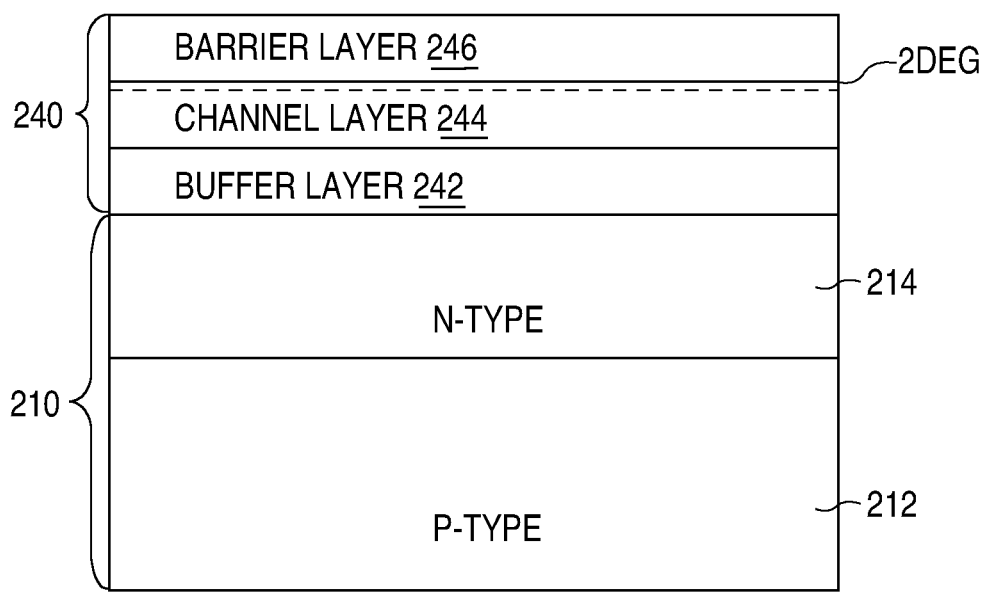

As shown in FIG. 5, once the multi-layered substrate structure 210 has been formed, a layered region 240 is formed on the substrate structure 210. The layered region 240, in turn, includes a buffer layer 242, a channel layer 244, and a barrier layer 246. The buffer layer 242, the channel layer 244, and the barrier layer 246 can each be implemented with one or more sequential group-III nitride layers, with the group-III including one or more of In, Ga, and Al. For example, the buffer layer 242 can be implemented with sequential layers of AlN (a thermally-stable material), AlGaN, and GaN. In addition, the channel layer 244 can be implemented with, for example, GaN, and the barrier layer 246 can be implemented with, for example, AlGaN.

The layered region 240 can be formed in a conventional manner, such as by placing the multi-layered substrate structure 210 in a MOCVD reactor and epitaxially growing the buffer layer 242 on the top surface of the substrate structure 210, the channel layer 244 on the top surface of the buffer layer 242, and the barrier layer 246 on the top surface of the channel layer 244.

Figure 6:
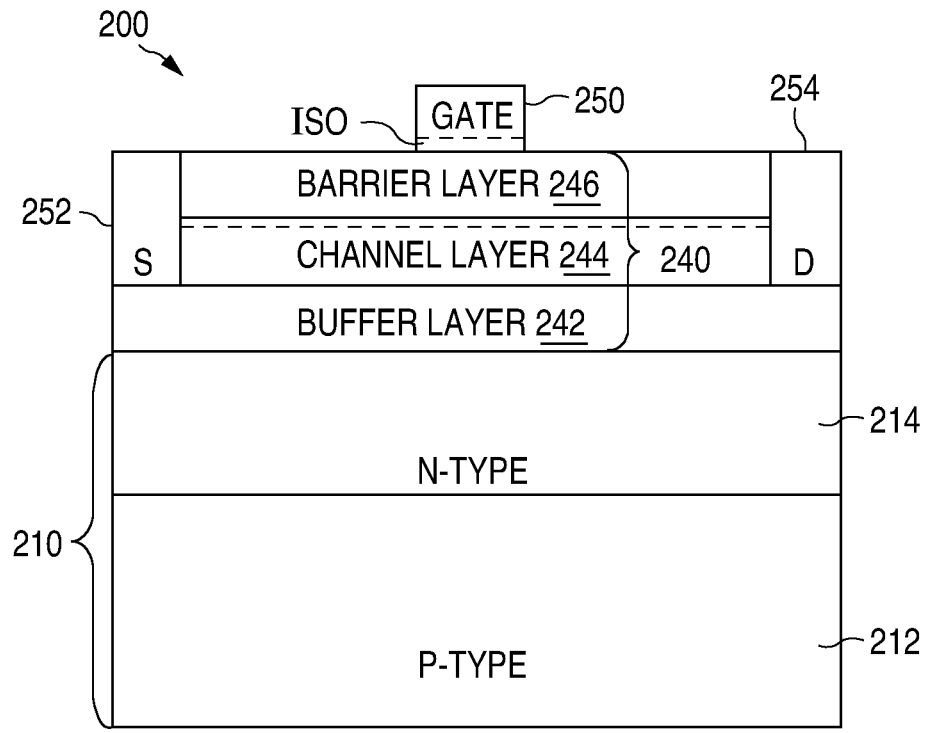

As shown in FIG. 6, following the conventional formation of the layered region 240, the method completes the formation of group III-N HEMT 200 by implant isolating or removing the barrier layer 246 and the channel layer 244 that lie in between the devices, and forming a metal gate region 250, a metal source region 252, and a metal drain region 254 in a conventional fashion.

The metal gate region 250 is formed to make a Schottky contact, while the metal source region 252 and the metal drain region 254 are formed to make an ohmic contact with the channel layer 244. Alternately, as shown by the dashed line in FIG. 6, the gate 250 can be isolated from the barrier layer 246 by an insulating layer ISO.

Figure 7:
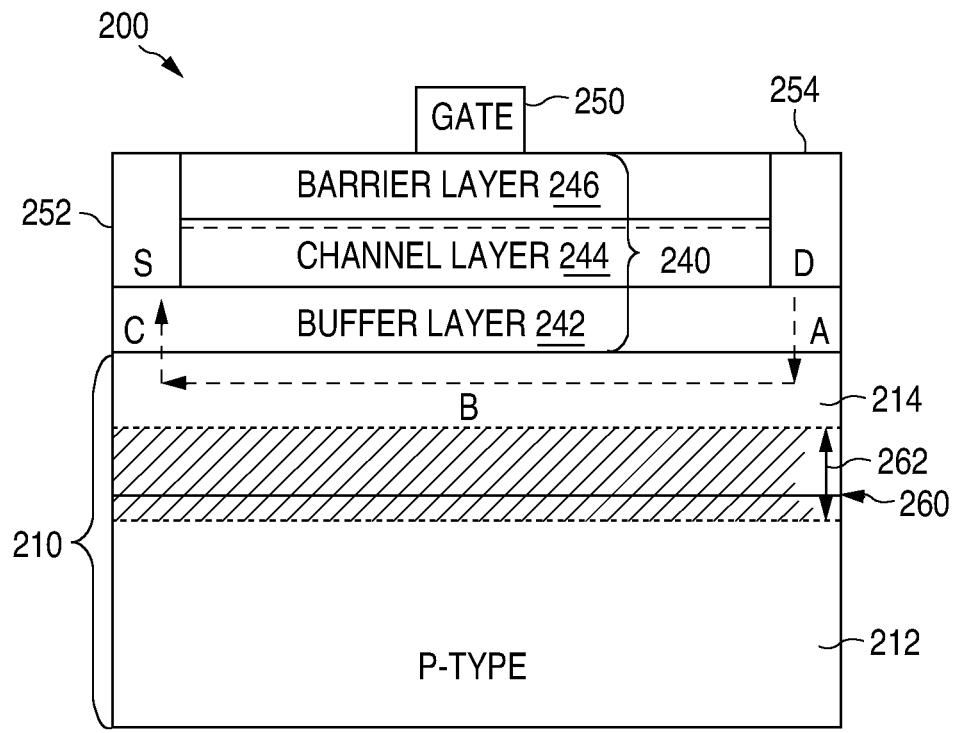
FIG. 7 is a cross-sectional view illustrating the operation of group III-N HEMT 200 in accordance with the present invention.

FIG. 7 shows a cross-sectional view that illustrates the operation of group III-N HEMT 200 in accordance with the present invention. As shown in FIG. 7, the p-type lower layer 212 and the n-type upper layer 214 in the multi-layered substrate structure 210 form a p-n junction 260 with a depletion region 262 that electrically isolates the n-type upper layer 214 from the p-type lower layer 212, thereby allowing the n-type upper layer 214 to electrically float. As a result, when the drain-to-source material breaks down, a breakdown current follows a path from the metal drain region 254 to the metal source region 252 that includes the breakdown path segments A, B, and C.

Thus, one of the advantages of the present invention is that by electrically floating the n-type upper layer 214, group III-N HEMT 200 provides the full breakdown voltage (600V) that is obtained by a conventional floating Si substrate. It is the reverse-biased breakdown voltage of the p-n junction 260 that allows the upper n-type layer 214 to electrically float. As a result, the dopant concentration used to form the n-type upper layer 214 (n-type layer 222 or n-type Si layer 232) is selected to insure that the reverse-biased breakdown voltage of the p-n junction 260 is equal to or greater than the breakdown voltage of path segment C.

Further, the n-type upper layer 214 cannot be too thin. For example, the growth of AlGaN in the buffer layer 242 can cause Al or Ga diffusion into the silicon. The diffusion forms a p-type region which can extend through the n-type upper layer 214, thereby shorting the p-n junction 260 if the n-type upper layer 214 is too thin. As a result, the n-type upper layer 214 needs to be thick enough and have enough doping to avoid this.

Another advantage of the present invention is that the multi-layered substrate structure 210 allows the p-type lower layer 212 to be electrically grounded. As a result, a conductive epoxy, which provides better thermal conductivity than a non-conductive epoxy, can be used to attach group III-N HEMT 200 to a package. A further advantage of the present invention is that multi-layered substrate structure 210 reduces the likelihood of crosstalk from capacitive coupling between adjacent devices, and also reduces the likelihood of EMI radiation if the floating voltage changes rapidly.

Figure 8:
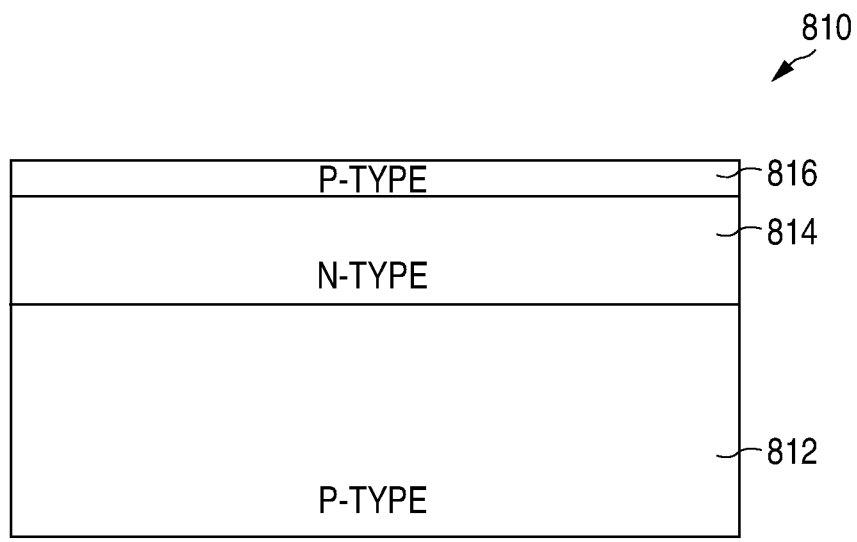
FIGS. 8-12 are a series of cross-sectional views illustrating an example of a method of forming a group III-N HEMT 800 in accordance with a first alternate embodiment of the present invention.

FIGS. 8-13 show a series of cross-sectional views that illustrate an example of a method of forming a group III-N HEMT 800 in accordance with a first alternate embodiment of the present invention. As shown in FIG. 8, the method of the first alternate embodiment begins by forming a multi-layered substrate structure 810 that includes a p-type lower layer 812, an n-type intermediate layer 814, and a p-type upper layer 816. Thus, the substrate structure 810 differs from the substrate structure 210 in that the substrate structure 810 includes a top p-type layer.

The p-type lower layer 812 has a substantially uniform thickness, the n-type intermediate layer 814 has a substantially uniform thickness, and the p-type upper layer 816 has a substantially uniform thickness. As a result, the bottom surface of the p-type lower layer 812, the bottom surface of the n-type intermediate layer 814, and the bottom surface of the p-type upper layer 816 lie in substantially parallel planes. The multi-layered substrate structure 810, in turn, can be formed in several different ways.

Figure 9:
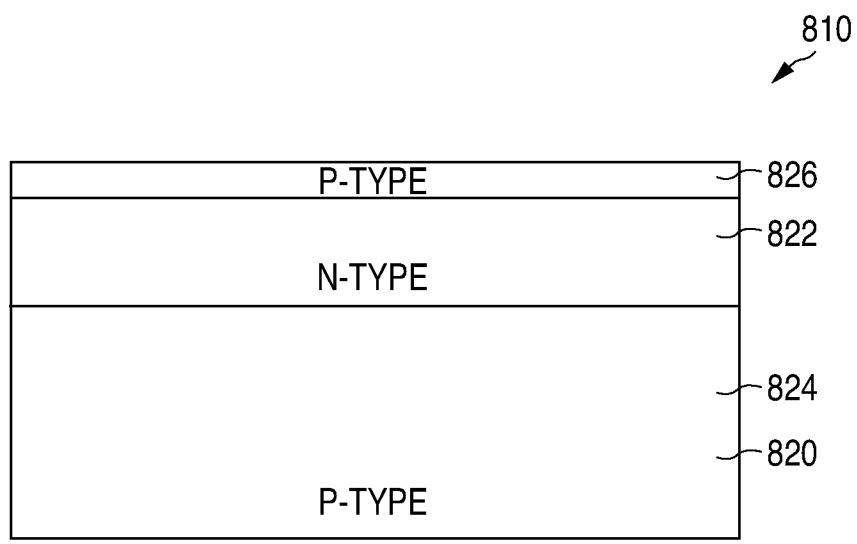

For example, as shown in FIG. 9, in a first embodiment, the multi-layered substrate structure 810 can be formed with a method that utilizes a conventionally-formed, lightly-doped, p-type, single-crystal Si substrate 820, such as <111>, and begins by blanket implanting an n-type dopant, such as phosphorous and/or arsenic, into the top surface of the Si substrate 820.

Unlike the implant that formed n-type layer 214, the implant energy must be sufficient to drive the dopant well below the top surface of the Si substrate 820. The blanket implant is then followed by an anneal that diffuses and activates the implant to form an n-type buried layer 822 that lies between a p-type bottom layer 824 and a p-type top layer 826.

Figure 10:
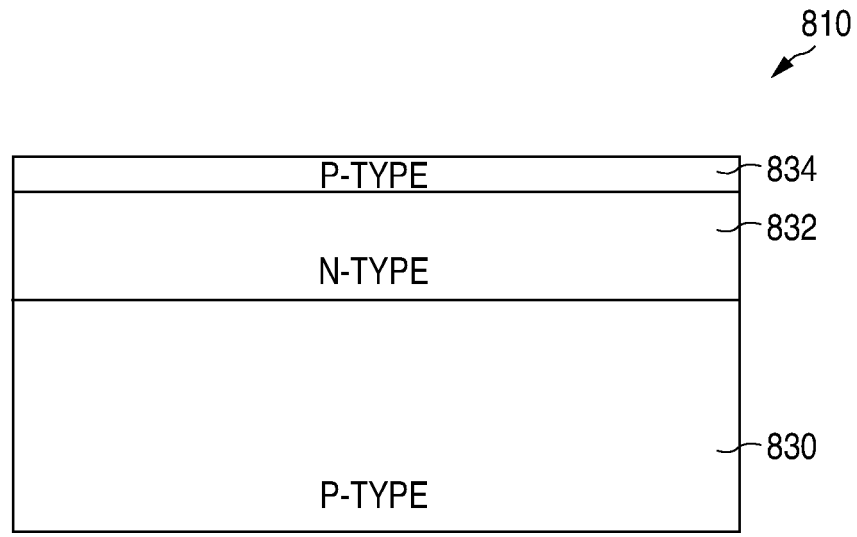

Alternately, as shown in FIG. 10, in a second embodiment, the multi-layered substrate structure 810 can be formed with a method that utilizes a conventionally-formed, lightly-doped, p-type, single-crystal Si substrate 830, such as <111>, and begins by epitaxially growing an n-type Si layer 832 on the top surface of the Si substrate 830. Following this, a p-type Si layer 834 is epitaxially grown on the top surface of the n-type layer 832.

Figure 11:
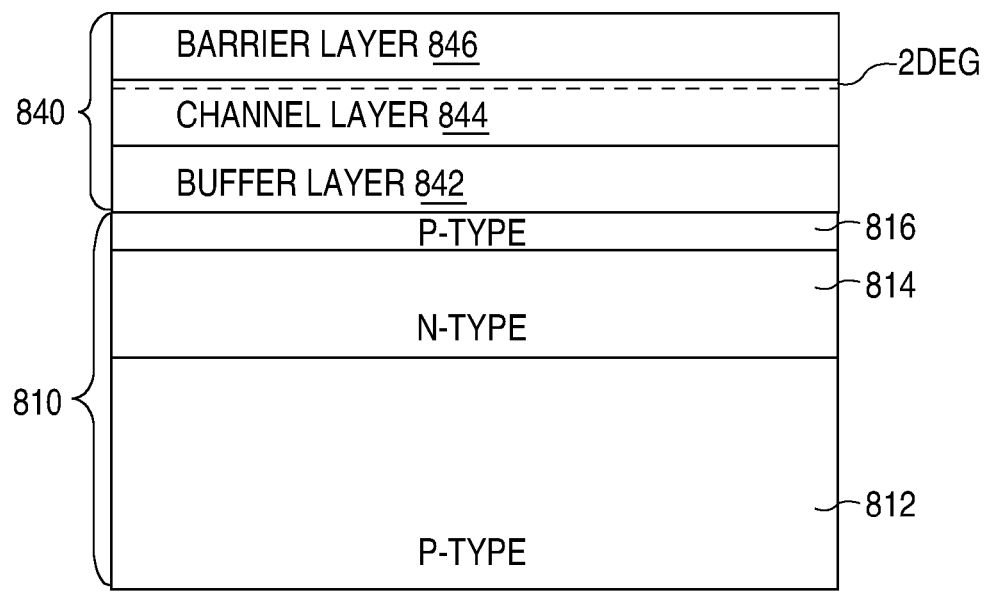

As shown in FIG. 11, once the multi-layered substrate structure 810 has been formed, a layered region 840 is formed on substrate structure 810. The layered region 840, in turn, includes a buffer layer 842, a channel layer 844, and a barrier layer 846. The buffer layer 842, the channel layer 844, and the barrier layer 846 can each be implemented with one or more sequential group-III nitride layers, with the group-III including one or more of In, Ga, and Al.

For example, the buffer layer 842 can be implemented with sequential layers of AlN, AlGaN, and GaN. In addition, the channel layer 844 can be implemented with, for example, GaN, and the barrier layer 846 can be implemented with, for example, AlGaN. In addition, as further shown in FIG. 11, no portion of the buffer layer 842 touches the n-type intermediate layer 814.

The layered region 840 can be formed in the same conventional manner that layered region 240 is formed, such as by placing the multi-layered substrate structure 810 in a MOCVD reactor and epitaxially growing the buffer layer 842 on the top surface of the substrate structure 810, the channel layer 844 on the top surface of the buffer layer 842, and the barrier layer 846 on the top surface of the channel layer 844.

Figure 12:
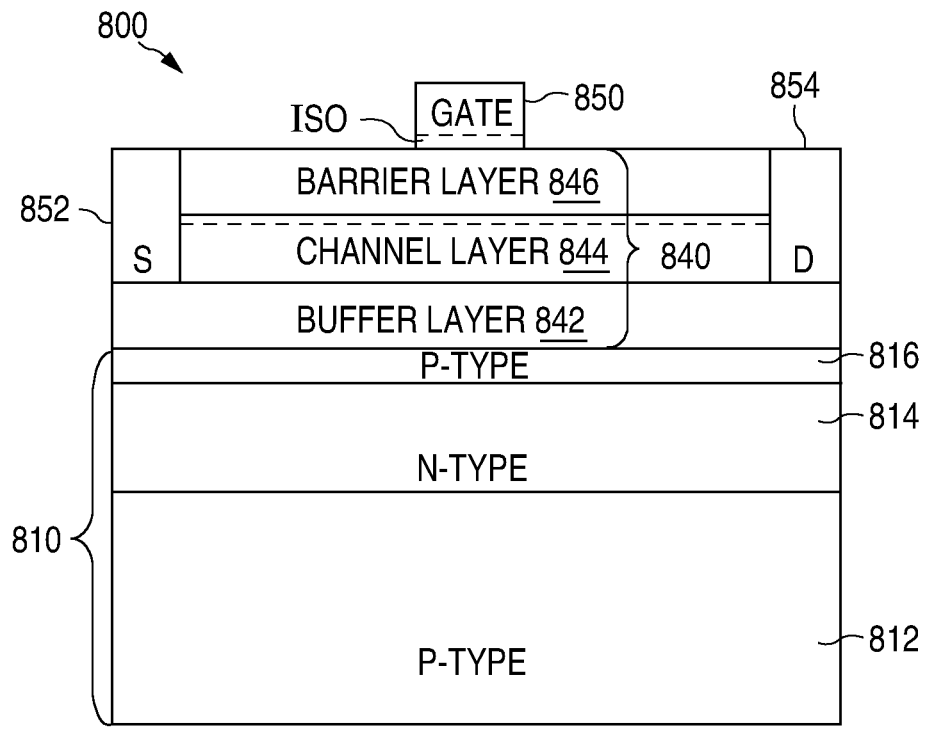

As shown in FIG. 12, following the conventional formation of layered region 840, the method completes the formation of group III-N HEMT 800 by implant isolating or removing the barrier layer 846 and the channel layer 844 that lie in between the devices, and forming a metal gate region 850, a metal source region 852, and a metal drain region 854 in a conventional fashion.

The metal gate region 850 is formed to make a Schottky contact, while the metal source region 852 and the metal drain region 854 are formed to make an ohmic contact with the channel layer 844. Alternately, as shown by the dashed line in FIG. 12, the gate 850 can be isolated from the barrier layer 846 by an insulating layer ISO.

Figure 13:
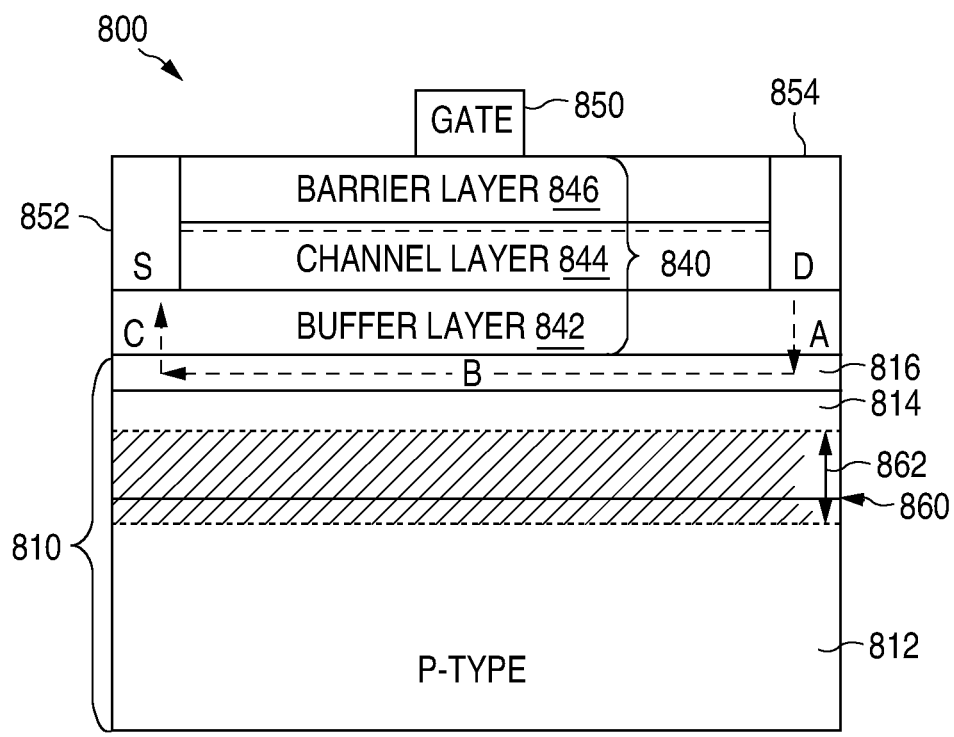
FIG. 13 is a cross-sectional view illustrating the operation of group III-N HEMT 800 in accordance with the present invention.

FIG. 13 shows a cross-sectional view that illustrates the operation of group III-N HEMT 800 in accordance with the present invention. As shown in FIG. 13, the p-type lower layer 812 and the n-type intermediate layer 814 in the multi-layered substrate structure 810 form a p-n junction 860 with a depletion region 862 that electrically isolates the p-type upper layer 816 from the p-type lower layer 812, thereby allowing the p-type upper layer 816 to electrically float. As a result, when the drain-to-source material breaks down, a breakdown current follows a path from the metal drain region 854 to the metal source region 852 that includes the breakdown path segments A, B, and C.

Thus, one of the advantages of the present invention is that by electrically floating the p-type upper layer 816, group III-N 800 provides the full breakdown voltage (600V) that is obtained by a conventional floating Si substrate. It is the reverse-biased breakdown voltage of the p-n junction 860 that allows the upper p-type layer 816 to electrically float.

As a result, the dopant concentration used to form the n-type intermediate layer 814 (n-type buried layer 822 or n-type Si layer 832) is selected to insure that the reverse-biased breakdown voltage of the p-n junction 860 is equal to or greater than the breakdown voltage of path segment C.

The reason to have p-type upper layer 816 is because the growth of AlGaN in the buffer layer 842 can cause Al or Ga diffusion into the silicon. The diffusion forms a p-type region whose characteristics are variable. P-type upper layer 816 is thick enough to contain this unintended diffusion, thereby providing well defined junctions in the substrate.

Another advantage of the present invention is that the multi-layered substrate structure 810 allows the p-type lower layer 812 to be electrically grounded. As a result, a conductive epoxy, which provides better thermal conductivity than a non-conductive epoxy, can be used to attach group III-N 800 to a package.

Figure 14:
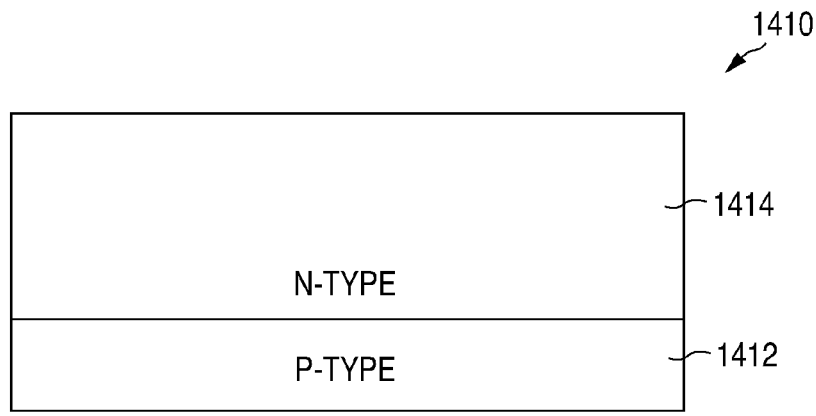
FIGS. 14-19 are a series of cross-sectional views illustrating an example of a method of forming a group III-N HEMT 1400 in accordance with a second alternate embodiment of the present invention.

FIGS. 14-19 show a series of cross-sectional views that illustrate an example of a method of forming a group III-N 1400 in accordance with a second alternate embodiment of the present invention. As shown in FIG. 14, the method of the second alternate embodiment begins by forming a multi-layered substrate structure 1410 that includes a p-type lower layer 1412 and an n-type upper layer 1414.

The p-type lower layer 1412, which has a substantially uniform thickness, is substantially thinner than the n-type upper layer 1414, which has a substantially uniform thickness. As a result, the bottom surface of the p-type lower layer 1412 and the bottom surface of the n-type upper layer 1414 lie in substantially parallel planes. The multi-layered substrate structure 1410, in turn, can be formed in several different ways.

Figure 15:
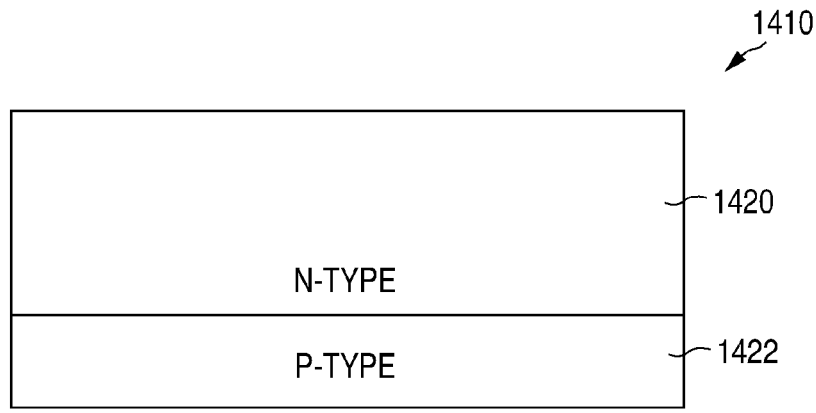

For example, as shown in FIG. 15, in a first embodiment, the multi-layered substrate structure 1410 can be formed with a method that utilizes a conventionally-formed, lightly-doped, n-type, single-crystal Si substrate 1420, such as <111>, and begins by blanket implanting a p-type dopant, such as boron, into the bottom surface of the Si substrate 1420. The blanket implant is then followed by an anneal that diffuses and activates the implant to form a p-type bottom layer 1422.

Figure 16:
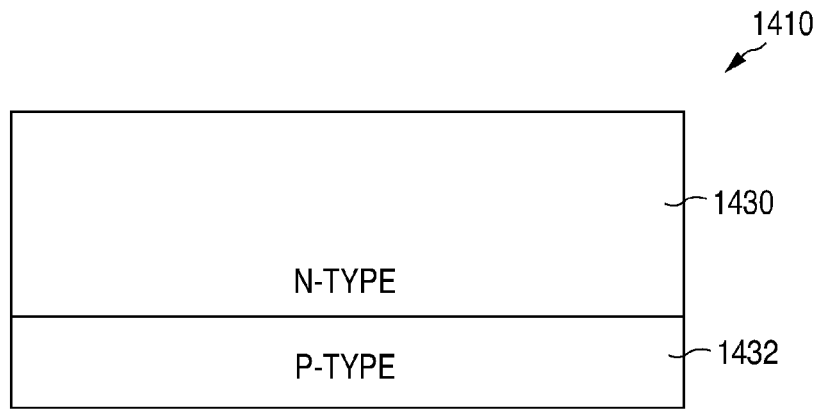

Alternately, as shown in FIG. 16, in a second embodiment, the multi-layered substrate structure 1410 can be formed with a method that utilizes a conventionally-formed, double-polished, lightly-doped, n-type, single-crystal Si substrate 1430, such as <111>, and includes epitaxially growing a p-type Si layer 1432 on the bottom surface of the Si substrate 1430.

Figure 17:
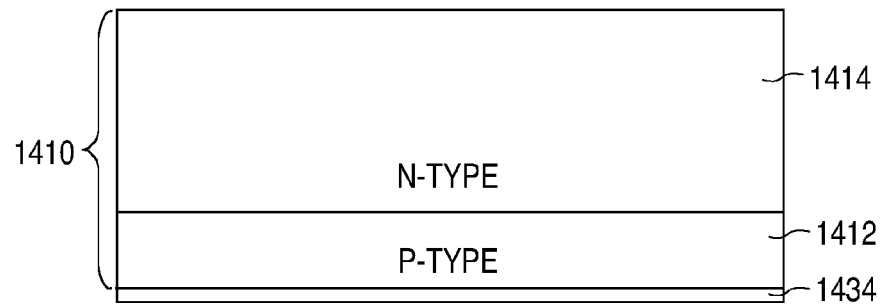

As shown in FIG. 17, after the multi-layered substrate structure 1410 has been formed, a protective layer 1434 is formed on the p-type lower layer 1412. The protective layer 1434 can be implemented with, for example, silicon nitride.

The protective layer 1434, which protects the p-type lower layer 1412 from scratches during processing, is removed prior to packaging.

Figure 18:
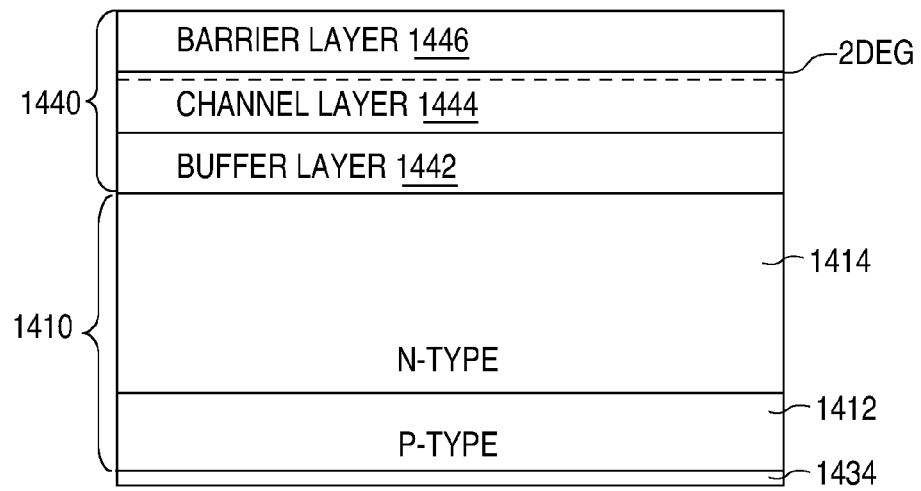

As shown in FIG. 18, once the protective layer 1434 has been formed, a layered region 1440 is formed on substrate structure 1410. The layered region 1440, in turn, includes a buffer layer 1442, a channel layer 1444, and a barrier layer 1446. The buffer layer 1442, the channel layer 1444, and the barrier layer 1446 can each be implemented with one or more sequential group-III nitride layers, with the group-III including one or more of In, Ga, and Al.

For example, the buffer layer 1442 can be implemented with sequential layers of AlN, AlGaN, and GaN. In addition, the channel layer 1444 can be implemented with, for example, GaN, and the barrier layer 1446 can be implemented with, for example, AlGaN. In addition, as further shown in FIG. 18, no portion of the buffer layer 1442 touches the p-type lower layer 1412.

The layered region 1440 can be formed in the same conventional manner that layered region 240 is formed, such as by placing the multi-layered substrate structure 1410 in a MOCVD reactor and epitaxially growing the buffer layer 1442 on the top surface of the substrate structure 1410, the channel layer 1444 on the top surface of the buffer layer 1442, and the barrier layer 1446 on the top surface of the channel layer 1444.

Figure 19:
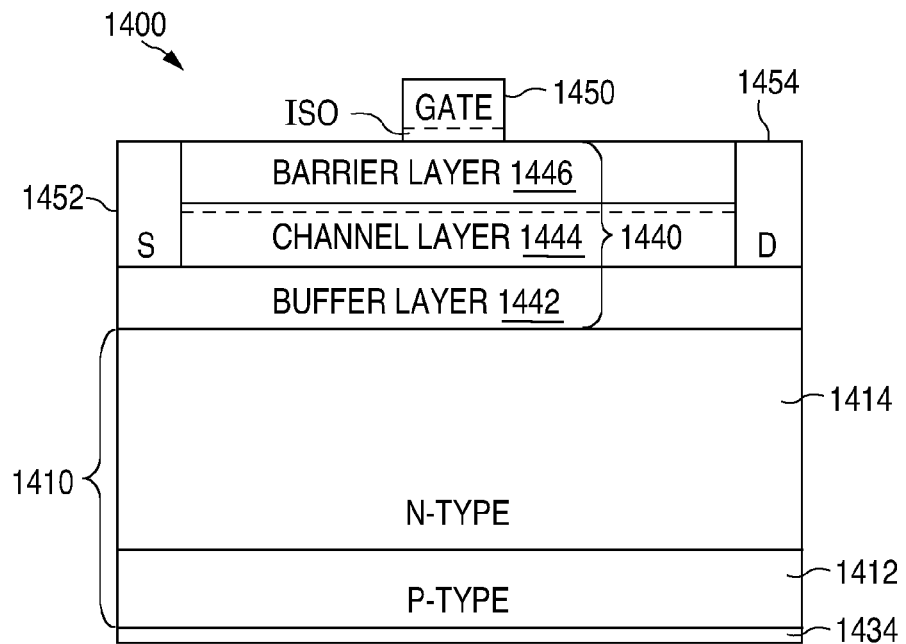

As shown in FIG. 19, following the conventional formation of the layered region 1440, the method completes the formation of group III-N HEMT 1400 by implant isolating or removing the barrier layer 1446 and the channel layer 1444 that lie in between the devices, and forming a metal gate region 1450, a metal source region 1452, and a metal drain region 1454 in a conventional fashion.

The metal gate region 1450 is formed to make a Schottky contact, while the metal source region 1452 and the metal drain region 1454 are formed to make an ohmic contact with the channel layer 1444. Alternately, as shown by the dashed line in FIG. 19, the gate 1450 can be isolated from the barrier layer 1446 by an insulating layer ISO.

Figure 20:
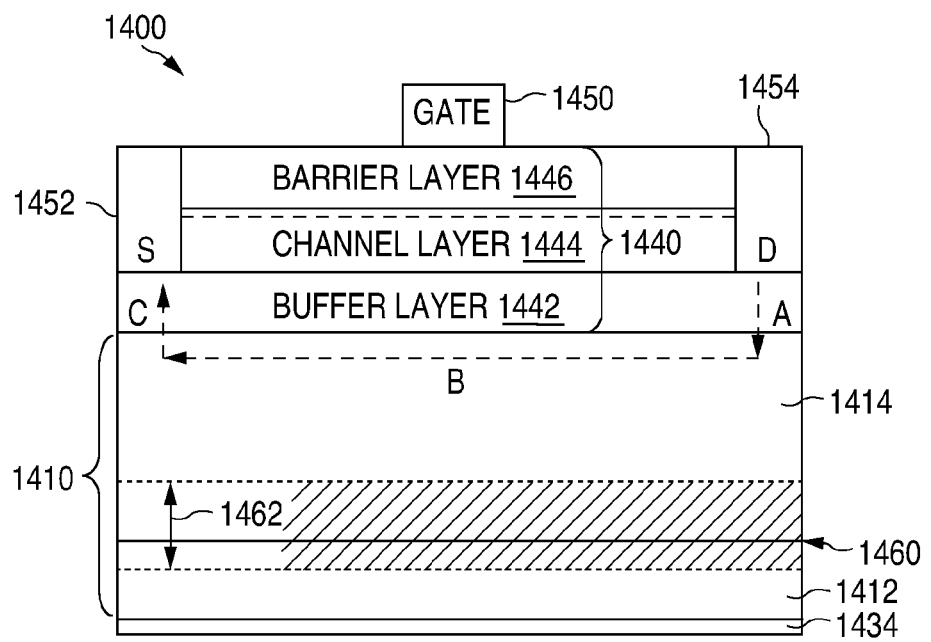
FIG. 20 is a cross-sectional view illustrating the operation of group III-N HEMT 1400 in accordance with the present invention.

FIG. 20 shows a cross-sectional view that illustrates the operation of group III-N HEMT 1400 in accordance with the present invention. As shown in FIG. 20, the p-type lower layer 1412 and the n-type upper layer 1414 in the multi-layered substrate structure 1410 form a p-n junction 1460 with a depletion region 1462 that electrically isolates the n-type upper layer 1414 from the p-type lower layer 1412, thereby allowing the n-type upper layer 1414 to electrically float. As a result, when the drain-to-source material breaks down, a breakdown current follows a path from the metal drain region 1454 to the metal source region 1452 that includes the breakdown path segments A, B, and C.

Thus, one of the advantages of the present invention is that by electrically floating the n-type upper layer 1414, group III-N HEMT 1400 provides the full breakdown voltage (600V) that is obtained by a conventional floating Si substrate. It is the reverse-biased breakdown voltage of the p-n junction 1460 that allows the upper n-type layer 1414 to electrically float. As a result, the dopant concentration used to form the p-type lower layer 1412 (p-type lower layer 1422 or p-type Si layer 1432) and the n-type upper layer 1414 (n-type substrate 1420 or n-type substrate 1430) are selected to insure that the reverse-biased breakdown voltage of the p-n junction 1460 is equal to or greater than the breakdown voltage of path segment C.

Another advantage of the present invention is that the multi-layered substrate structure 1410 allows the p-type lower layer 1412 to be electrically grounded. As a result, a conductive epoxy, which provides better thermal conductivity than a non-conductive epoxy, can be used to attach group III-N HEMT 1400 to a package.

A further advantage of the alternate embodiment of the present invention is that the p-n junction 1460 lies closer to the package which, in turn, functions as a heat sink. Placing the p-n junction 1460 closer to the heat sink reduces the temperature of the p-n junction 1460. Si junctions typically do not work well over 200° C., whereas group III-N HEMTs can handle higher temperatures. As a result, the alternate embodiment allows group III-N HEMT 1400 to have a higher maximum operating temperature.

Group III-N HEMTs 200, 800, and 1400 can be formed as discrete devices or as part of an integrated circuit, where a large number of identical discrete devices or identical integrated circuits are formed on a wafer. After the discrete devices or integrated circuits on the wafer have been fabricated, one of the final processing steps is to cut or dice the wafer to physically separate the individual discrete devices or integrated circuits. The physically separated discrete devices or integrated circuits are then attached to a package which carries the discrete device or integrated circuit.

Figure 21:
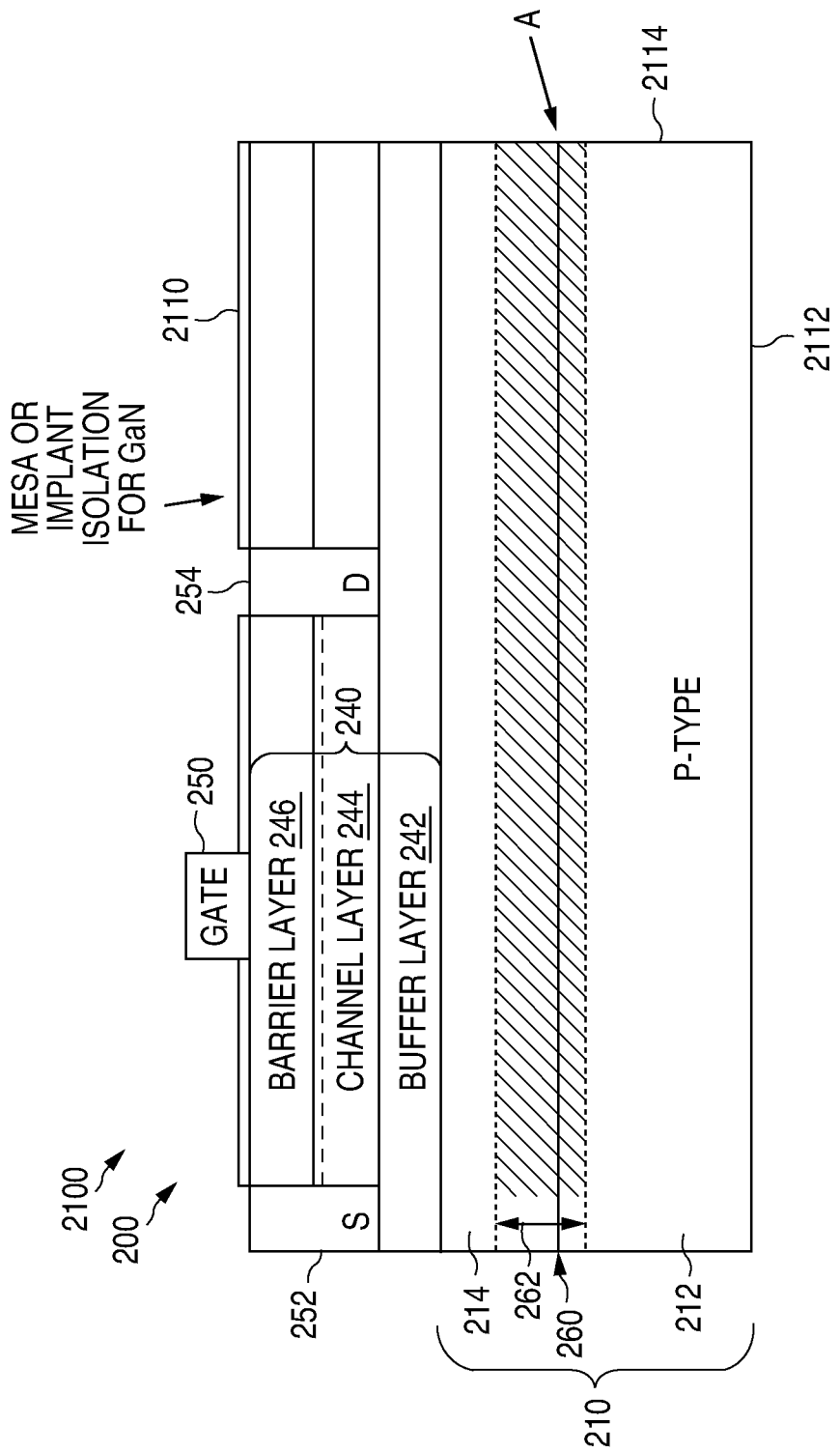
FIG. 21 is a cross-sectional view illustrating an example of a die 2100 in accordance with the present invention.

FIG. 21 shows a cross-sectional view that illustrates an example of a die 2100 in accordance with the present invention. As shown in FIG. 21, die 2100 includes a group III-N HEMT 200, a top surface 2110, a bottom surface 2112, and an edge 2114 that extends from top surface 2110 to bottom surface 2112. Edge 2114, in turn, was formed by the cleaving or sawing operation that formed die 2100 from the wafer.

As further shown in FIG. 21, the pn junction between p-type lower layer 212 and an n-type upper layer 214 of multi-layered substrate structure 210 extends over and contacts edge 2114 at point A. As a result, edge 2114 exposes the pn junction between p-type lower layer 212 and an n-type upper layer 214.

An exposed pn junction at the edge of a die, in turn, typically breakdowns at a lower electric field than a pn junction in the bulk due to the presence of imperfections at the edge that result from the cut. As a result, the pn junction between p-type lower layer 212 and an n-type upper layer 214 will typically breakdown at edge 2114 before it breaks down in the region that lies directly below group III-N HEMT 200.

Figure 22:
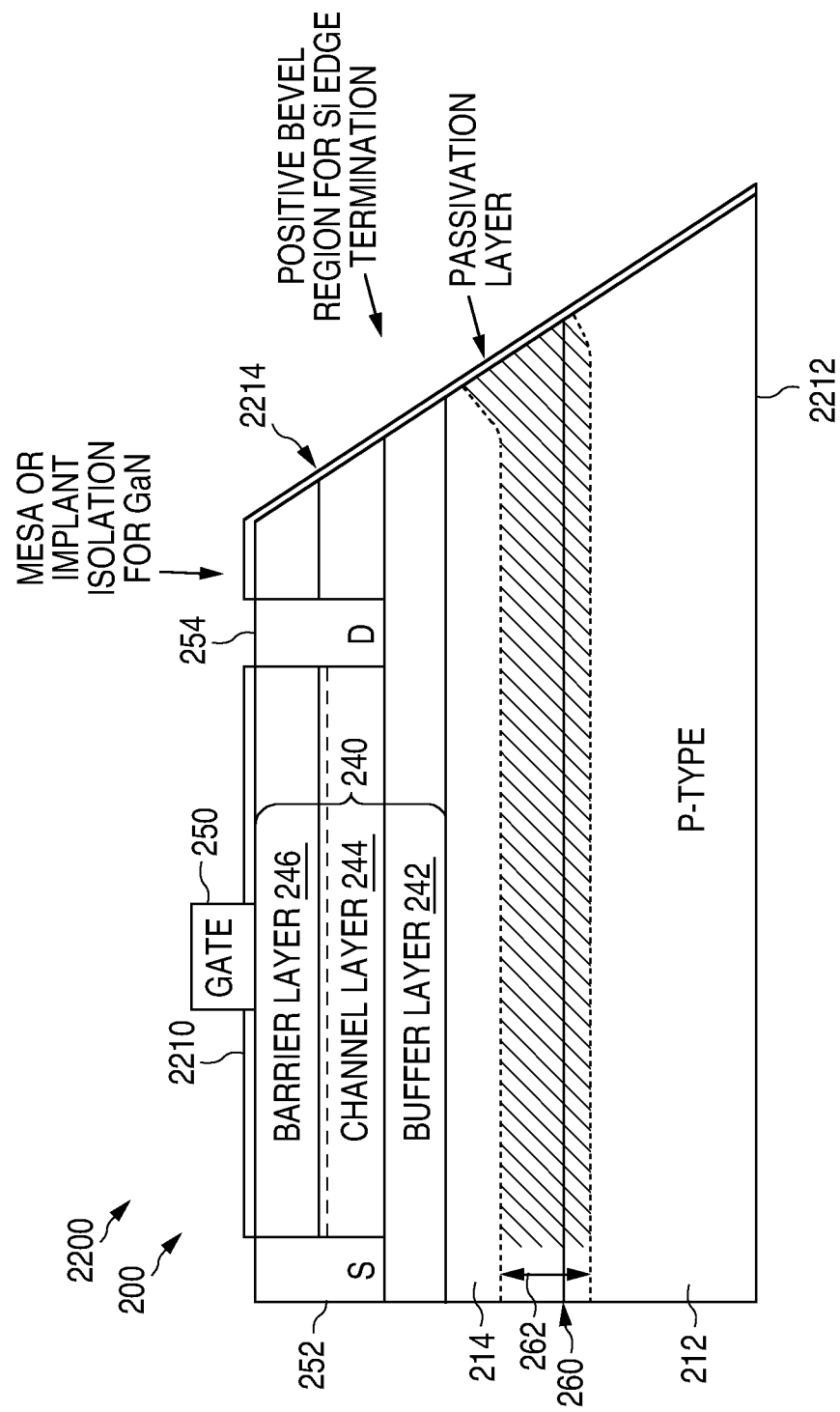
FIG. 22 is a cross-sectional view illustrating an example of a die 2200 in accordance with the present invention.

FIG. 22 shows a cross-sectional view that illustrates an example of a die 2200 in accordance with the present invention. As shown in FIG. 22, die 2200 includes a group III-N HEMT 200, a top surface 2210, a bottom surface 2212, and a beveled edge 2214 that extends from top surface 2210 to bottom surface 2212.

Beveled edge 2214 is formed to remove a larger amount of the more lightly doped side of the junction than it does from the more heavily doped side of the junction. In the present example, p-type lower layer 212 has a larger dopant concentration (e.g., $5 \times 10^{15}$ cm$^{-3}$) than the dopant concentration of n-type upper layer 214 (e.g., $5 \times 10^{14}$ cm$^{-3}$). As a result, beveled edge 2214 is formed so that the width of die 2200 gets wider with depth, which is known as a positive bevel angle.

As further shown in FIG. 22, as a result of removing a larger amount of the more lightly doped n-type upper layer 214, depletion region 262 curves upward, becoming much wider at edge 2214. The increased width of depletion region 262 substantially increases the junction breakdown voltage at edge 2214, thereby compensating for the presence of imperfections at edge 2214 that result from the cut.

Figure 23:
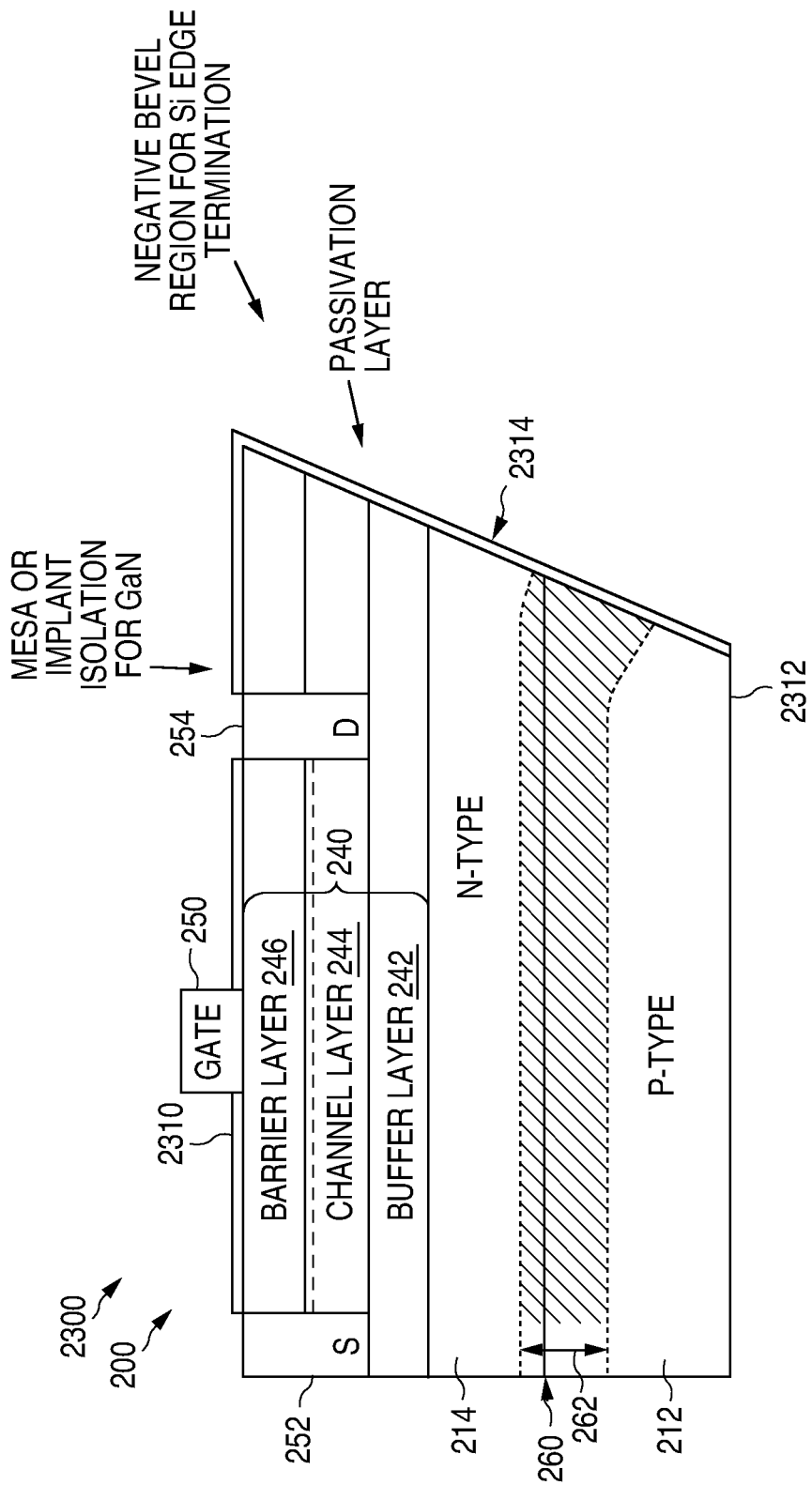
FIG. 23 is a cross-sectional view illustrating an example of a die 2300 in accordance with the present invention.

FIG. 23 shows a cross-sectional view that illustrates an example of a die 2300 in accordance with the present invention. As shown in FIG. 23, die 2300 includes a group III-N HEMT 200, a top surface 2310, a bottom surface 2312, and a beveled edge 2314 that extends from top surface 2310 to bottom surface 2312.

As above, beveled edge 2314 is formed to remove a larger amount of the more lightly doped side of the junction than it does from the more heavily doped side of the junction. In the present example, p-type lower layer 212 has a smaller dopant concentration (e.g., $5 \times 10^{14}$ cm$^{-3}$) than the dopant concentration of n-type upper layer 214 (e.g., $5 \times 10^{15}$ cm$^{-3}$). As a result, beveled edge 2314 is formed so that the width of die 2300 gets narrower with depth, which is known as a negative bevel angle.

As further shown in FIG. 23, as a result of removing a larger amount of the more lightly doped p-type lower layer 212, depletion region 262 curves downward, becoming much wider at edge 2314. The increased width of depletion region 262 substantially increases the junction breakdown voltage at edge 2314, thereby compensating for the presence of imperfections at edge 2314 that result from the cut.

Figure 24:
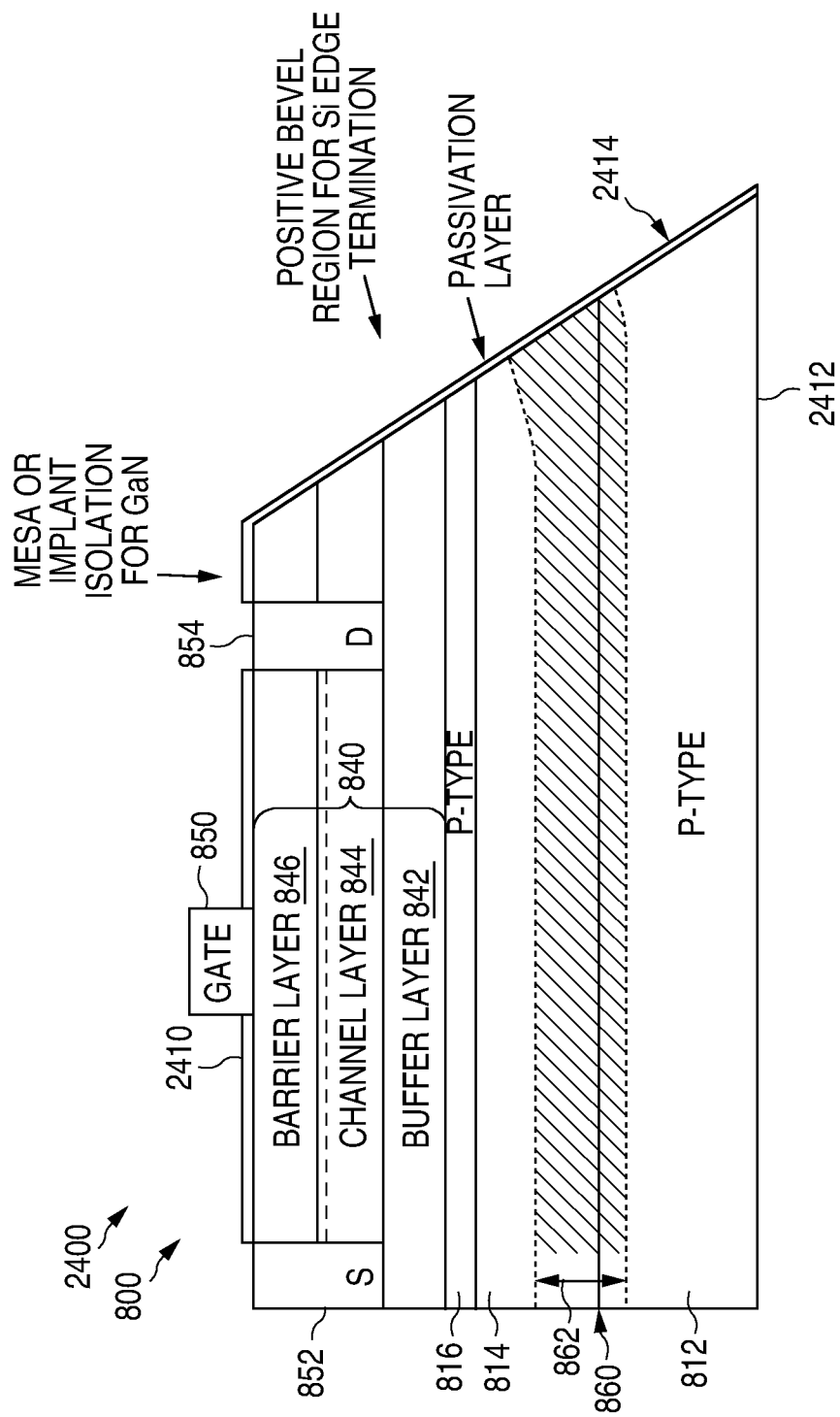
FIG. 24 is a cross-sectional view illustrating an example of a die 2400 in accordance with the present invention.

Beveled edges can also be applied to a die which has a group III-N HEMT 800 and a die which has a group III-N HEMT 1400. FIG. 24 shows a cross-sectional view that illustrates an example of a die 2400 in accordance with the present invention. As shown in FIG. 24, die 2400 includes a group III-N HEMT 800, a top surface 2410, a bottom surface 2412, and a positive beveled edge 2414 that extends from top surface 2410 to bottom surface 2412.

In die 2400, p-type lower layer 812 has a larger dopant concentration than the dopant concentration of n-type upper layer 814. Thus, the bevel removes a larger amount of the more lightly doped n-type upper layer 814. As a result of removing a larger amount of the more lightly doped n-type upper layer 814, depletion region 862 curves upward, becoming much wider at edge 2414. The increased width of depletion region 862 increases the junction breakdown voltage at edge 2414, thereby compensating for the presence of imperfections at edge 2414 that result from the cut.

Figure 25:
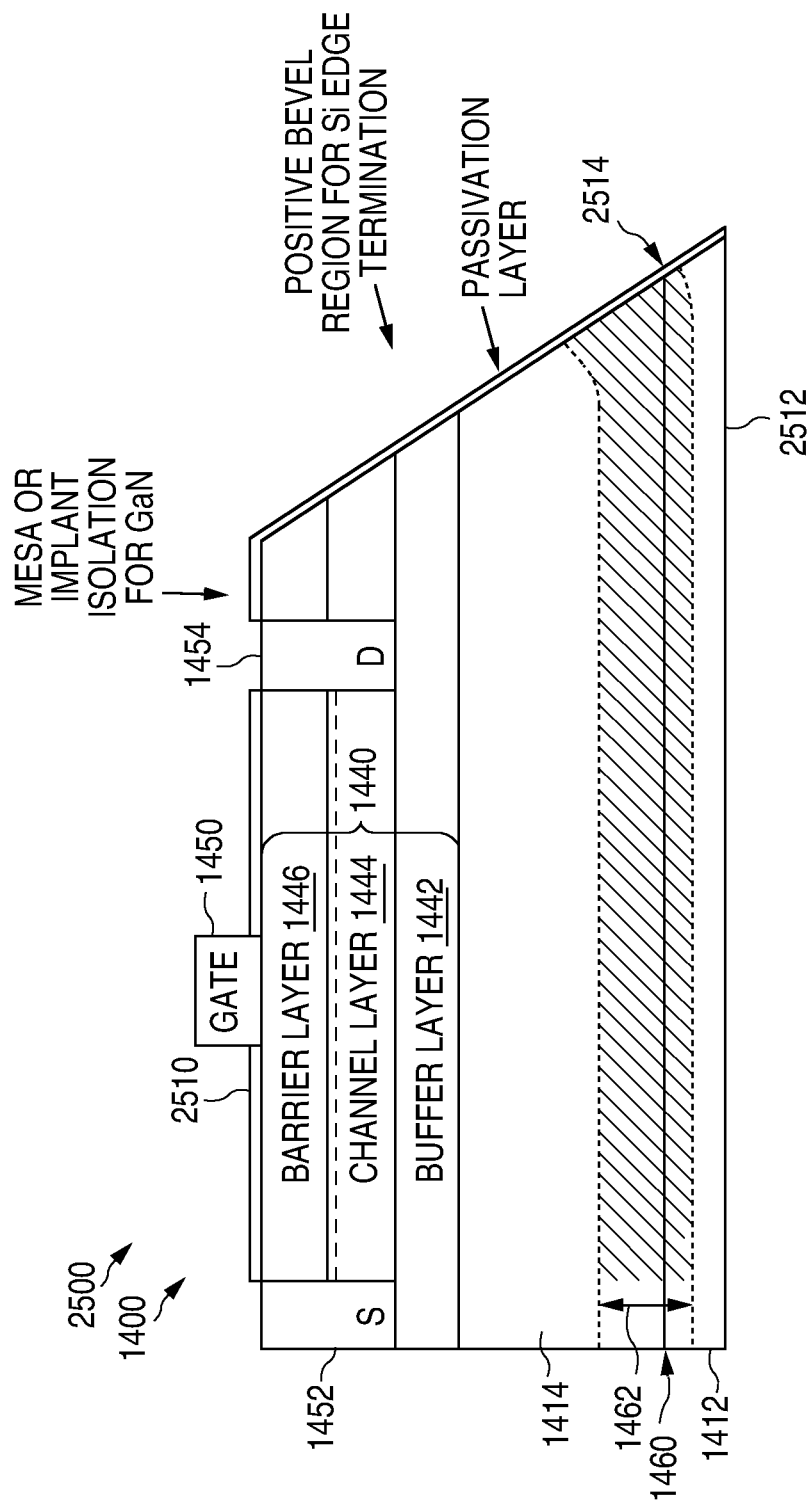
FIG. 25 is a cross-sectional view illustrating an example of a die 2500 in accordance with the present invention.

FIG. 25 shows a cross-sectional view that illustrates an example of a die 2500 in accordance with the present invention. As shown in FIG. 25, die 2500 includes a group III-N HEMT 1400, a top surface 2510, a bottom surface 2512, and a positive beveled edge 2514 that extends from top surface 2510 to bottom surface 2512.

In die 2500, p-type lower layer 1412 has a larger dopant concentration than the dopant concentration of n-type upper layer 1414. Thus, the bevel removes a larger amount of the more lightly doped n-type upper layer 1414. As a result of removing a larger amount of the more lightly doped n-type upper layer 1414, depletion region 1462 curves upward, becoming much wider at edge 2514. The increased width of depletion region 1462 increases the junction breakdown voltage at edge 2514, thereby compensating for the presence of imperfections at edge 2514 that result from the cut.

The beveled edges 2214, 2314, 2414, and 2514 are formed in a conventional manner. For example, the edge of the wafer can be sprayed with an abrasive, such as grit, while the wafer is attached to a heat sink (e.g., molybdenum) and rotated. The angle of the spray, which is preferably 30° to 60°, determines the angle of the bevel.

After the wafer is cut, the edges 2114 2214, 2314, 2414, and 2514 are passivated before the dice 2100, 2200, 2300, 2400, and 2500 are packaged. As discussed in U.S. Pat. No. 4,980,315 and V. Obreja, "The semiconductor-dielectric interface from PN junction edge and the voltage dependence of leakage reverse current", International Semiconductor Device Research Symposium (ISDRS) December 2007, a p-n junction in a beveled or mesa-type semiconductor structure can be passivated by depositing a dielectric like silicon dioxide and/or silicon nitride. U.S. Pat. No. 4,980,315, which issued on Dec. 25, 1990 to Einthoven et al., is hereby incorporated by reference.

In addition, as discussed in V. Obreja and C. Codreanu, "Experimental investigation on the leakage reverse current component flowing at the semiconductor PN junction periphery", Int. Conf. on Thermal and Multiphysics (EuroSimE) 2006, a silicone rubber compound or polyimide, such as is prior-art in the passivation of plane or mesa-type high-voltage silicon junctions, can alternately be used.

Further, as discussed in U.S. Pat. No. 3,859,127, high-resistivity polycrystalline silicon can also be deposited to passivate the junctions of mesa-type semiconductor devices. U.S. Pat. No. 3,859,127, which issued on Jan. 7, 1975 to Lehner, is hereby incorporated by reference. B. J. Baliga, "Fundamentals of Power Semiconductor Devices", Springer, 2008, also discusses the passivation of p-n junctions in plane or mesa-type power devices.

It should be understood that the above descriptions are examples of the present invention, and that various alternatives of the invention described herein may be employed in practicing the invention. For example, group III-N HEMTs are conventionally formed as depletion-mode devices, but can also be formed as enhancement-mode devices.

The present invention applies equally well to enhancement-mode devices as the substrate and buffer layer structures of these devices are the same. Therefore, it is intended that the following claims define the scope of the invention and that structures and methods within the scope of these claims and their equivalents be covered thereby.

What is claimed is:

1. A method of forming a transistor comprising:
forming a multi-layered substrate structure having a first layer of p-type material, having a first doping level and a second layer of n-type material, having a lightly doped bottom portion and a heavily doped top portion, that touches a top surface of the first layer, wherein the lightly doped portion of the second layer is lighter doping than the first doping level, wherein the first layer is substantially thicker than the second layer, the multi-layered substrate structure having a top surface, the first layer and the second layer of the multi-layered substrate structure forming a p-n junction therebetween;
forming a buffer layer to touch the top surface of the multi-layered substrate structure, no portion of the buffer layer touching the first layer, the buffer layer having a top surface and including a group III-nitride, wherein the n-type second layer is configured to be thick enough and have enough doping to prevent the buffer layer from forming a p-type region in the n-type second layer, which extends through the n-type second layer, thereby shorting the p-n junction formed by the n-type second layer and the p-type first layer;
forming a channel layer to touch the top surface of the buffer layer, the channel layer including a group III-nitride and having a top surface;
forming a barrier layer to touch the top surface of the channel layer, the barrier layer including a group III-nitride;
forming spaced-apart metal source and drain regions that contact the channel layer; and
forming a beveled edge that extends from the top surface of the barrier layer to the bottom surface of the multi-layer substrate structure, the beveled edge being formed by removing a larger amount of the more lightly doped side of the p-n junction than it does from the more heavily doped side of the p-n junction resulting in a beveled edge that is wider at the top of the die than at the bottom of the die, known as a positive bevel angle, the positive bevel resulting in removing a larger amount from the more lightly doped second layer to cause the depletion region to curve upward, becoming much wider at the beveled edge, wherein the increased width of the depletion region, substantially increasing the junction breakdown voltage at the edge of the bevel.

2. The method of claim 1 wherein the metal drain region is spaced apart from the second layer.

3. The method of claim 1 further comprising spraying an edge of the multi-layered substrate structure with an abrasive so that a width of the multi-layered substrate structure changes with depth.

4. The method of claim 1 wherein the multi-layered substrate further includes a third layer of the first conductivity type that touches a top surface of the second layer.

5. The method of claim 4 wherein the buffer layer touches a top surface of the third layer.

6. The method of claim 5 wherein no portion of the buffer layer touches the second layer.

7. A transistor comprising:
   a multi-layered substrate structure that has a first layer of p-type material, having a first doping level and a second layer of n-type material, having a lightly doped bottom portion and a heavily doped top portion, that touches a top surface of the first layer, wherein the lightly doped portion of the second layer is lighter doping than the first doping level, wherein the first layer is substantially thicker than the second layer, the multi-layered substrate structure having a top surface, the first layer and the second layer of the multi-layered substrate structure forming a p-n junction therebetween;
   a buffer layer that touches the top surface of the multi-layered substrate structure, no portion of the buffer layer touching the first layer, the buffer layer having a top surface and including a group III-nitride, wherein the n-type second layer is configured to be thick enough and have enough doping to prevent the buffer layer from forming a p-type region in the n-type second layer, which extends through the n-type second layer, thereby shorting the p-n junction formed by the n-type second layer and the p-type first layer;
   a channel layer that touches the top surface of the buffer layer, the channel layer including a group III-nitride and having a top surface;
   a barrier layer that touches the top surface of the channel layer, the barrier layer including a group III-nitride;
   spaced-apart metal source and drain regions that contact the channel layer; and
   a beveled edge that extends from the top surface of the barrier layer to the bottom surface of the multi-layer substrate structure, the beveled edge being formed by removing a larger amount of the more lightly doped side of the p-n junction than it does from the more heavily doped side of the p-n junction resulting in a beveled edge that is wider at the top of the die than at the bottom of the die, known as a positive bevel angle, the positive bevel resulting in removing a larger amount from the more lightly doped second layer to cause the depletion region to curve upward, becoming much wider at the beveled edge, wherein the increased width of the depletion region, substantially increasing the junction breakdown voltage at the edge of the bevel.

8. The transistor of claim 7 wherein the metal drain region is spaced apart from the second layer.

9. The transistor of claim 7 wherein a width of the multi-layered substrate structure changes with depth.

10. The transistor of claim 7 wherein the multi-layered substrate further includes a third layer of the first conductivity type that touches a top surface of the second layer.

11. The transistor of claim 10 wherein the buffer layer touches a top surface of the third layer.

12. The transistor of claim 11 wherein no portion of the buffer layer touches the second layer.

* * * * *